US008860698B2

(12) United States Patent
Yamada

(10) Patent No.: US 8,860,698 B2
(45) Date of Patent: *Oct. 14, 2014

(54) ELECTRO-OPTICAL MODULE, POWER SUPPLY SUBSTRATE, WIRING SUBSTRATE, AND ELECTRONIC APPARATUS

(75) Inventor: Tadashi Yamada, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 1166 days.

This patent is subject to a terminal disclaimer.

(21) Appl. No.: 12/289,324

(22) Filed: Oct. 24, 2008

(65) Prior Publication Data

US 2009/0067029 A1 Mar. 12, 2009

Related U.S. Application Data

(63) Continuation of application No. 10/843,388, filed on May 12, 2004, now Pat. No. 7,460,112.

(30) Foreign Application Priority Data

Jun. 2, 2003 (JP) ................................. 2003-157390

(51) Int. Cl.
*H05K 1/11* (2006.01)
*H05K 1/14* (2006.01)

(52) U.S. Cl.
CPC ..................................... *H05K 1/147* (2013.01)
USPC ............. 345/204; 345/207; 345/98; 345/100; 345/206; 345/211; 345/205; 345/102; 349/33; 349/34; 359/245

(58) Field of Classification Search
USPC ........... 345/207, 98, 100, 206, 211, 205, 102; 349/33, 34; 359/245
See application file for complete search history.

(56) References Cited

U.S. PATENT DOCUMENTS

| 4,494,172 | A | 1/1985 | Leary et al. |
| 4,597,635 | A * | 7/1986 | Hoshikawa ..................... 349/73 |
| 4,862,153 | A | 8/1989 | Nakatani et al. |
| 5,754,155 | A * | 5/1998 | Kubota et al. .................. 345/98 |
| 6,690,110 | B1 | 2/2004 | Yamada et al. |
| 6,721,023 | B1 * | 4/2004 | Weiss et al. ..................... 349/87 |
| 6,771,248 | B2 | 8/2004 | Tanaka et al. |
| 6,825,820 | B2 | 11/2004 | Yamazaki et al. |
| 6,853,430 | B2 | 2/2005 | Murahashi et al. |
| 6,947,019 | B2 * | 9/2005 | Sato et al. ........................ 345/82 |
| 6,972,966 | B1 | 12/2005 | Oishi et al. |
| 2002/0140645 | A1 * | 10/2002 | Sato et al. ........................ 345/82 |
| 2002/0158859 | A1 * | 10/2002 | Nakano et al. ................ 345/204 |
| 2004/0008492 | A1 * | 1/2004 | Kato et al. ..................... 361/715 |

FOREIGN PATENT DOCUMENTS

| CN | 1288171 A | 3/2001 |
| JP | A-62-280889 | 12/1987 |
| JP | A-10-209581 | 8/1998 |
| JP | A-10-215038 | 8/1998 |
| JP | A-11-038434 | 2/1999 |
| JP | A-2000-029058 | 1/2000 |
| JP | A-2000-294040 | 10/2000 |

(Continued)

*Primary Examiner* — Olga Merkoulova
(74) *Attorney, Agent, or Firm* — Oliff PLC

(57) ABSTRACT

This invention provides an electro-optical module with reduced noise in driving voltage. The invention can include a power supply substrate that is arranged separately from the flexible substrate having a driver, so that the noise of the driving voltage supplied from the power supply substrate is reduced.

11 Claims, 9 Drawing Sheets

(56) References Cited

FOREIGN PATENT DOCUMENTS

| | | |
|---|---|---|
| JP | A-2001-109395 | 4/2001 |
| JP | A-2001-264792 | 9/2001 |
| JP | A-2001-284751 | 10/2001 |
| JP | A-2001-324721 | 11/2001 |
| JP | A-2002-132180 | 5/2002 |
| JP | A-2002-151276 | 5/2002 |
| JP | A-2002-244580 | 8/2002 |
| JP | A-2002-287109 | 10/2002 |
| JP | A-2003-023248 | 1/2003 |
| JP | A-2003-140612 | 5/2003 |
| KR | 1999-14011 | 2/1999 |
| KR | 2001-0056031 | 7/2001 |
| KR | 2001-87355 | 9/2001 |

* cited by examiner

ELECTRO-OPTICAL MODULE, POWER SUPPLY SUBSTRATE, WIRING SUBSTRATE, AND ELECTRONIC APPARATUS

This is a Continuation of application Ser. No. 10/843,388 filed May 12, 2004, which claims the benefit of Japanese Patent Application No. 2003-157390 filed Jun. 2, 2003. The disclosures of the prior applications are hereby incorporated by reference herein in their entirety.

BACKGROUND OF THE INVENTION

1. Field of Invention

The invention relates to an electro-optical module, a power supply substrate, a wiring substrate, and an electronic apparatus.

2. Description of Related Art

A type for mounting an electro-optical panel having an electro-optical element, such as a liquid crystal device, on an electronic apparatus, such as cellular phone and television has been known in the related art. See, for example, Japanese Unexamined Patent Application Publication No. 10-209581.

In order to safely drive the electro-optical element on the electro-optical panel, a method for mounting the electro-optical panel, a method for connecting the electro-optical panel to a wiring substrate, configuration or structure of the electro-optical module need to be considered in addition to the configuration of the electro-optical panel itself. As the electro-optical panel has been densely integrated, problems, such as noise or a delay, in control signal or instability of the driving voltage need to be solved in consideration of the mounting type.

An object of the invention is to provide the electro-optical module and related components which are designed to solve the above-mentioned problem.

SUMMARY OF THE INVENTION

The first electro-optical module of the invention can include an electro-optical panel having a plurality of electro-optical elements, a wiring substrate connected to the electro-optical panel and having a driver for generating a signal to be supplied to the electro-optical panel, and a power supply substrate for generating a panel driving voltage for driving the plurality of electro-optical elements. The panel driving voltage can be supplied to the electro-optical panel through the wiring substrate. In the electro-optical module, the wiring substrate having the driver and the power supply substrate may be separately arranged, so that only the power supply substrate may be examined to facilitate detection of operational faults.

When the function of the driver and the function of the power supply circuit are integrated as integrated circuits (IC), all of ICs need to be replaced with good ones when some functions as mentioned above are detected to be faulty, however, the function of the power supply substrate is installed in the power supply circuit separate from the wiring substrate with the driver, as is done in the electro-optical module of the invention, only the power supply substrate may be replaced with a good one when the function of the power supply circuit is detected to have operational faults.

In addition, the term electro-optical panel means a panel having electro-optical elements and is represented by, for example, a display panel such as a liquid crystal panel or an organic electroluminescent (EL) panel. The term electro-optical module means one having an electro-optical panel and is represented by, for example, a liquid crystal module or an organic EL module.

In the above-mentioned electro-optical module, it is preferable that the panel driving voltage be supplied to the electro-optical panel, not through the driver but through driving voltage wiring formed in the wiring substrate. With this configuration, problems such as instability of the panel driving voltage, signal slowdown, or signal delay due to interference between the panel driving voltage supplied to the electro-optical panel, and data signal, clock signal, or the like for controlling the electro-optical panel generated in the driver may be reduced.

In the electro-optical module, it is preferable that the power supply substrate further generate a driver driving voltage for driving the driver, and the driver driving voltage be supplied to the driver. One advantage of the electro-optical module may be to replace the power supply substrate with a new one having a desired specification, which allows it to adjust the driver driving voltage.

In the electro-optical module, a reference voltage used for generating the panel driving voltage and a driver control signal for controlling the driver in the power supply substrate are supplied from outside through a first connector formed in the wiring substrate, and the reference voltage is supplied to the power supply substrate through a second connector different from the first connector formed in the wiring substrate.

In the above-mentioned electro-optical module, the term reference voltage may include ground potential, or voltage of a battery power supply supplied from an external device such as a body of a cellular phone or the like.

In the above-mentioned electro-optical module, the panel driving voltage or the driver driving voltage is generated based on the ground potential and the voltage of the battery power supply.

In the above-mentioned electro-optical module, the panel driving voltage or the driver driving voltage may be supplied from the power supply substrate through the second connector and the wiring substrate.

In the above-mentioned electro-optical module, it is preferable that a wiring length ranging from the first connector to the second connector of reference voltage wiring formed in order to supply the reference voltage to the power supply substrate be shorter than that of driver control signal wiring for supplying the driver control signal from the first connector to the driver. In other words, the reference voltage wiring is preferably dragged for a short distance. By this configuration, instability of the reference voltage supplied from outside may be reduced.

In the above-mentioned electro-optical module, it is preferable that a line width of the reference voltage wiring be larger than that of the driver control signal wiring. By this configuration, problems, such as voltage drop resulting when the reference voltage reaches the power supply substrate, may be reduced.

The invention can provide a power supply substrate for generating an electro-optical panel driving voltage or a driving voltage to be supplied to a driver for driving the electro-optical panel, based on a reference voltage supplied from outside, having a first conductive layer for transmitting the driving voltage, in which at least a portion is formed of a first conductive material, and a second conductive layer for transmitting the reference voltage, in which at least a portion is formed of a second conductive material, wherein the first conductive layer and the second conductive layer are separated from each other by at least one insulating layer.

In other words, conductive layers containing conductive material are stacked, which allows the area occupied by the power supply substrate to be reduced. In addition, the first conductive layer may have an electronic circuit for generating the driving voltage.

In the above-mentioned power supply substrate, it is preferable to further include a third conductive layer of which at least a portion is formed of a third conductive material and which is connected to a predetermined potential. The predetermined potential refers to, for example, a voltage of the above-mentioned ground potential or a voltage of a battery power supply.

In the electro-optical module where this power supply substrate is overlapped with signal wirings for transmitting data signals, noise may be blocked by the third conductive layer even if the signal wirings act as a noise source, which leads to suppression of the instability of the driving voltage. This effect may be further improved by increasing the area that the third conductive material occupies in the third conductive layer.

The invention provides a wiring substrate having a driver for generating a driving signal for driving a plurality of electro-optical elements in an electro-optical panel having the plurality of electro-optical elements, including a first connector for connecting an external device to the wiring substrate and a second connector for connecting a power supply substrate for generating a driving voltage for driving the plurality of electro-optical elements to the wiring substrate.

In the above-mentioned wiring substrate, for example, a signal or voltage, such as a control signal supplied to the driver or reference voltage, which are supplied from an external device, such as a body of a cellular phone, are supplied to the wiring substrate through the first connector, and voltage generated in the power supply substrate such as a panel driving voltage or a driving voltage for driving the driver are supplied to the wiring substrate through the second connector. A signal for controlling the power supply substrate through the second connector may be further supplied from the driver through the power supply substrate.

In the above-mentioned wiring substrate, it is preferable that the plurality of electro-optical elements be arranged between a plurality of pixel electrodes corresponding to the plurality of electro-optical elements, respectively, and a common electrode formed in common for the plurality of pixel electrodes, the wiring substrate further comprise first wiring for supplying the common voltage and second wiring for supplying a driving voltage to the plurality of pixel electrodes, and a line width of the first wiring be larger than that of the second wiring. By this configuration, a voltage may be safely supplied to the common electrode.

In the above-mentioned wiring substrate, the term common electrode means an opposite electrode that is arranged to face the pixel electrode. When the opposite electrode is negative, the potential of the common electrode is ground potential.

In the above-mentioned wiring substrate, it may be that the plurality of electro-optical elements can include a red electro-optical element, a green electro-optical element, and a blue electro-optical element, the plurality of electro-optical elements are arranged between a plurality of pixel electrodes corresponding to the plurality of electro-optical elements, respectively, and a common electrode formed in common for the plurality of pixel electrodes, the wiring substrate further comprises first wiring for supplying the common voltage, red-electro-optical-element wiring for supplying a driving voltage to a pixel electrode corresponding to the red electro-optical element, green-electro-optical-element wiring for supplying a driving voltage to a pixel electrode corresponding to the green electro-optical element, and blue-electro-optical-element wiring for supplying a driving voltage to a pixel electrode corresponding to the blue electro-optical element, and a line width of at least one wiring of the red-electro-optical-element wiring, the green-electro-optical-element wiring, and the blue-electro-optical-element wiring is different from the others.

In the above-mentioned wiring substrate, it is preferable that the plurality of electro-optical elements include a red electro-optical element, a green electro-optical element, and a blue electro-optical element, the plurality of electro-optical elements be arranged between a plurality of pixel electrodes corresponding to the plurality of electro-optical elements, respectively, and a common electrode formed in common for the plurality of pixel electrodes, the wiring substrate further comprise first wiring for supplying a common voltage, red-electro-optical-element wiring for supplying a driving voltage to a pixel electrode corresponding to the red electro-optical element, green-electro-optical-element wiring for supplying the driving voltage to the pixel electrode corresponding to the green electro-optical element, and blue-electro-optical-element wiring for supplying the driving voltage to the pixel electrode corresponding to the blue electro-optical element, and a line width of each type of the red-electro-optical-element wiring, the green-electro-optical-element wiring and the blue-electro-optical-element wiring be set according to the luminous efficiencies of the corresponding electro-optical elements.

When property or spectral luminous efficiency changes in response to color of the electro-optical element, the wiring substrate may allow the wiring widths to be adjusted based on the conditions, so that there exists an advantage in compensating the property or the spectral luminous efficiency.

In the above-mentioned wiring substrate, it may be that the plurality of electro-optical elements include a red electro-optical element, a green electro-optical element, and a blue electro-optical element, the plurality of electro-optical elements are arranged between a plurality of pixel electrodes corresponding to the plurality of electro-optical elements, respectively, and a common electrode formed in common for the plurality of pixel electrodes, the wiring substrate further comprises first wiring for supplying a common voltage, red-electro-optical-element wiring for supplying a driving voltage to a pixel electrode corresponding to the red electro-optical element, green-electro-optical-element wiring for supplying the driving voltage to the pixel electrode corresponding to the green electro-optical element, and blue-electro-optical-element wiring for supplying the driving voltage to the pixel electrode corresponding to the blue electro-optical element, and a line width of the red-electro-optical-element wiring is larger than those of the green electro-optical element and the blue electro-optical element.

The line width of the red-electro-optical-element wiring may be increased as in the wiring substrate, and thus the luminance of the red electro-optical element may be compensated even if the luminous efficiency of the red electro-optical element is relatively deteriorated.

In the above-mentioned wiring substrate, it is preferable that the plurality of electro-optical elements can include a red electro-optical element, a green electro-optical element, and a blue electro-optical element, the plurality of electro-optical elements be arranged between a plurality of pixel electrodes corresponding to the plurality of electro-optical elements, respectively, and a common electrode formed in common for the plurality of pixel electrodes, the wiring substrate further comprise first wiring for supplying a common voltage, red-electro-optical-element wiring for supplying a driving voltage to a pixel electrode corresponding to the red electro-optical element, green-electro-optical-element wiring for supplying the driving voltage to the pixel electrode corresponding to the green electro-optical element, and blue-electro-optical-element wiring for supplying the driving voltage to the pixel electrode corresponding to the blue electro-optical element, and a line width of the green-electro-optical-element wiring be narrower than those of the red-electro-optical-element wiring and the blue-electro-optical-element wiring.

In this way, the line width of the green-electro-optical-element wiring may be relatively reduced, which allows to compensate the luminance of the green pixel even if the luminous efficiency of the green electro-optical element is high.

In the above-mentioned wiring substrate, it is preferable that the wiring substrate be flexible, and at least a portion thereof be bent.

In the above-mentioned wiring substrate, a notch having three sides can be preferably formed in at least a portion of the wiring substrate. For example, three upper sides may be formed to a structure such as a driver formed in the wiring substrate. By this configuration, the structure may not be bent or damaged even when the wiring substrate is bent.

The second electro-optical module of the invention can include the above-mentioned wiring substrate, and an electro-optical panel connected to the wiring substrate, the wiring substrate and the electro-optical panel are connected to a connecting portion at one side of a plurality of sides forming the periphery of the electro-optical panel, the wiring substrate comprises a first portion, and a second portion formed by bending the wiring substrate and facing the first portion, the first portion is formed through a supporting member for supporting the electro-optical panel at a second main surface which is opposed to a first main surface existing in a direction where light of the electro-optical panel is emitted, the second portion is formed to allow the first portion to be interposed between the second main surface and the second portion, and the driver is interposed between the first portion and the second portion.

In other words, in the electro-optical module, a side which is opposed to a direction emitting light in the electro-optical module, that is, the rear surface of the electro-optical panel, is used, so that the wiring substrate is attached to the rear surface, thereby effectively utilizing space. Furthermore, the driver is interposed within the wiring substrate having a bent structure in the electro-optical module, which allows influence due to external factors such as mechanical power, light, or heat to be reduced.

In the above-mentioned electro-optical module, it is preferable that a first connector and a second connector be arranged in the second portion.

In the above-mentioned electro-optical module, it is preferable that a base and a first protrusion protruding from the base be formed in the second portion, and the first connector be arranged at an edge of the first protrusion.

In the above-mentioned electro-optical module, the first protrusion is preferably formed to be protruded from a side in which a connecting portion for connecting the electro-optical panel to the wiring substrate is located, of a plurality of sides forming the periphery of the electro-optical panel than a position to which the base of the second protrusion is attached. By this configuration, connection to an external device, such as a cellular phone, may be facilitated.

In the above-mentioned electro-optical module, it is preferable that a second protrusion protruding from the base be formed in the second portion, and the second connector be arranged at an edge of the second protrusion.

In the above-mentioned electro-optical module, a distance from the base to the edge of the first protrusion is preferably longer than that from the base to the edge of the second protrusion.

In the above-mentioned electro-optical module, a position where the base of the first protrusion is attached to is preferably formed closer to any one of two sides crossing with a side in which the connecting portion is located, of a plurality of sides forming the periphery of the electro-optical panel than a position to which the base of the second protrusion is attached.

In other words, the root position in the base of the second protrusion is preferably arranged at the center rather than that in the base of the first protrusion.

In the above-mentioned electro-optical module, it is preferable that it further include a power supply substrate connected through the second connector. The power supply substrate be formed in the second main surface through the supporting member and the first portion of the wiring substrate, and be arranged closer to the connecting portion of the electro-optical panel than the second connector.

As will be described later, when the driver is formed close to the connecting portion between the driver and the electro-optical panel, an interval between a plurality of wirings for connecting the driver to the connecting portion becomes larger when it is closer to the connecting portion. In other words, the distance between the wirings becomes shorter, and the distances of the plurality of wirings become different from one another, which causes time-based errors among signals transmitted through the wirings.

Therefore, the driver is preferably spaced by using a predetermined distance from the connecting portion between the driver and the electro-optical panel.

However, the space between the driver and the connecting portion for connecting the driver to the electro-optical panel becomes useless in the wiring substrate at one side thereof. As a result, this unused space is utilized in the electro-optical module of the present invention to thereby form the power supply substrate, which leads to effective utilization of the rear surface of the electro-optical panel.

In the above-mentioned electro-optical module, it is preferable that the supporting member be attached to the power supply substrate by a detachable mechanism. In the above-mentioned electro-optical module, the power supply substrate may be readily detached and replaced with a good one when it is detected to have a fault. In addition, it may be replaced with the power supply substrate having a desired specification, if necessary.

The electronic apparatus of the present invention can include the above-mentioned electro-optical module.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

Figure 1:
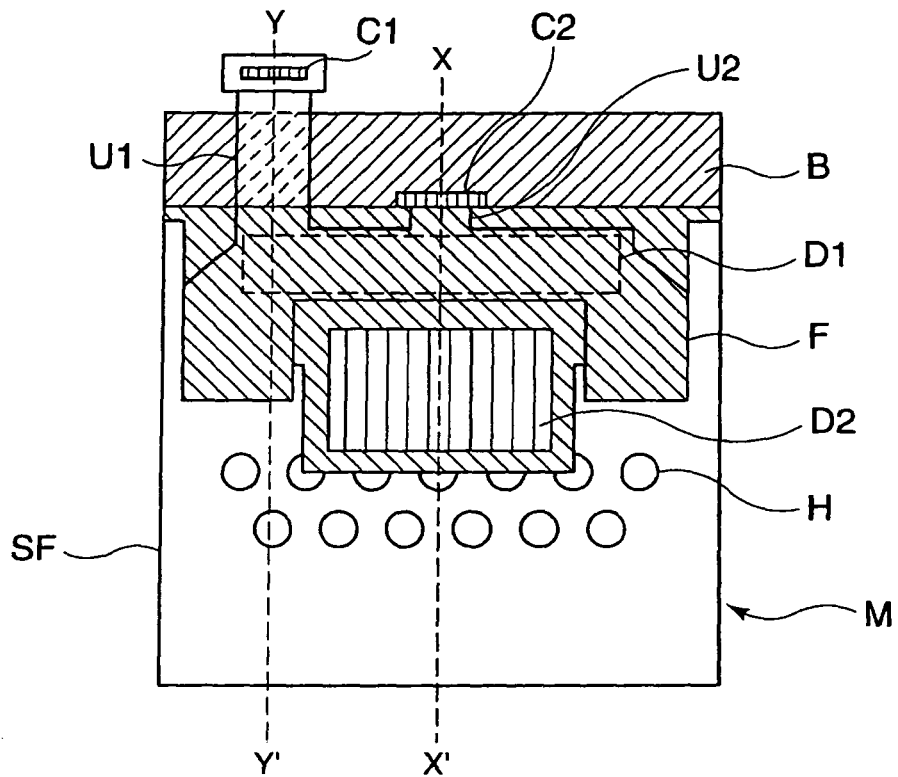
FIG. 1 shows a configuration of a rear surface of a display module according to an embodiment of the present invention.
Figure 2:
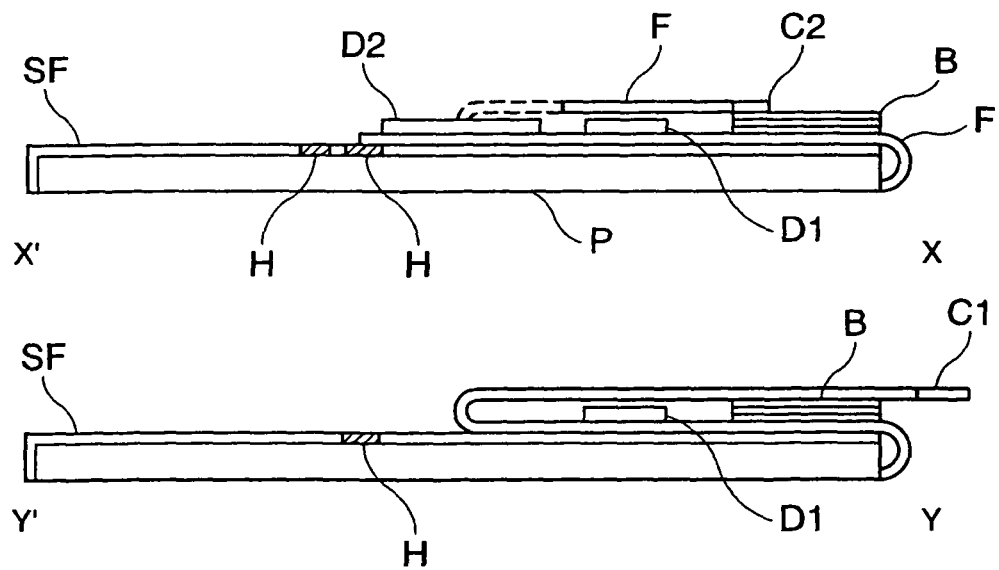
FIG. 2 shows a cross-sectional structure of a display module according to the embodiment of the present invention.
Figure 3:
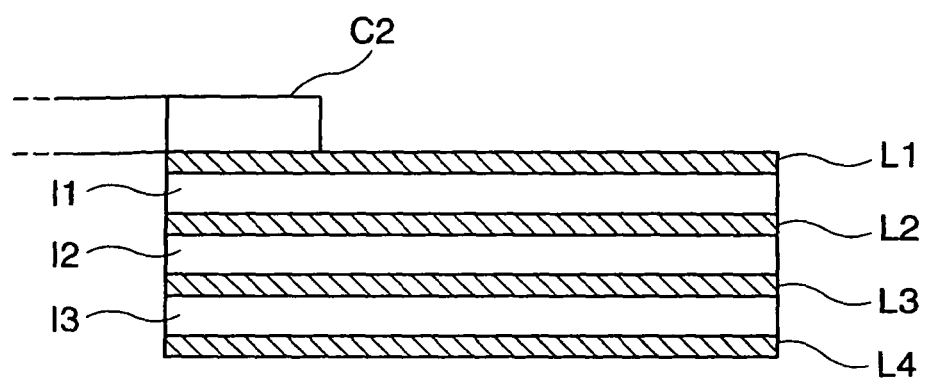
FIG. 3 shows a cross-sectional structure of a power supply substrate according to the embodiment of the present invention.

A display module M consists of a flexible substrate, a display panel P, and a frame SF for supporting the display panel P. FIG. 1 shows a configuration of a rear side of the display module (which is the opposite side of the display). FIG. 2 (A) and FIG. 2 (B) show cross sectional views taken along the line X-X' line and the line Y-Y' line of FIG. 1, respectively. In the rear side of the display module M as shown in FIG. 1, a flexible substrate F having a driver D1 and an auxiliary driver D2, and a power supply substrate B are arranged.

The driver D1 is interposed between two portions of the flexible substrate F bent as shown in FIG. 2 (B). The driver D1 generates a data signal, a precharge signal, a clock signal, a check signal, a control signal for controlling scanning line driving circuit, a control signal for controlling a driving voltage to be supplied to the driver D1 itself and the display panel P, or the like.

The auxiliary driver D2 has a notch (which corresponds to a notch to be described below with reference to FIG. 5) arranged in a region outside the above-mentioned bent portion of the flexible substrate F, so that the driver D2 is arranged in a developed portion. The auxiliary driver D2 is not covered by any portions of the flexible substrate F but exposed. The auxiliary driver D2 has a memory, a personal computer, and the like, so that it acts to support the operation of the driver D1.

The power supply substrate B mostly generates a driving voltage for the display panel including a pixel circuit, scanning line driving circuit, check circuit or the like, or a driving voltage for driving the driver D1.

The power supply substrate B can be connected to the flexible substrate through a second connector C2, and is fixed to the frame SF by means of devices to be described below. The flexible substrate F is connected to the display panel P to be bent from the side close to the power supply substrate B of the display panel P, and by this structure, the power supply substrate B is arranged near the connecting portion of the flexible substrate F and the display panel P closer than the driver D1.

A wiring pattern arranged from the driver to the electro-optical panel has a fan shape or a similar shape, and has the widened fan shape when the driver is arranged close to the connecting portion of the electro-optical panel and the driver. In other words, a large distance occurs between the wiring length positioned at a center portion and the wiring length positioned at an end. Owing to this, time-lag occurs between signals transmitted through the wiring. Therefore, the driver can be preferably arranged to be spaced from the connecting portion of the driver and the electro-optical panel by a predetermined distance.

In the meantime, the space between the driver and the connecting portion of the driver and the electro-optical panel becomes useless in a wiring substrate. Thus, in the electro-optical module according to the embodiment, this useless space is utilized to arrange the power supply substrate B, so that the space of the rear side of the electro-optical panel becomes useful.

As mentioned above, the driver D1 and the power supply substrate B are arranged not to be overlapped, which allows the thickness of the cross sectional direction of the display module M to be reduced.

In addition, the power supply substrate B can be connected to the flexible substrate F as shown in FIG. 2, however, the power supply substrate B may be spaced from the flexible substrate F so as to effectively scatter off heat generated from the power supply substrate B.

The frame SF is formed of a metal material, and by thermal conductivity of the metal material, heat generated by an electric conduction to the display panel P, or the like, is radiated outside the frame. Furthermore, the frame SF has a plurality of holes H to further improve a heat radiation effect.

Next, a cross sectional structure of the power supply substrate B will be described. The power supply substrate B has a multi-layered structure including a plurality of conductive layers. In the embodiment, specifically, it has four layers, which consists of a first conductive layer L1, a second conductive layer L2, a third conductive layer L3, and a fourth conductive layer L4, which are arranged in an order closer to the connecting portion of the connector C2. Any of the first conductive layer L1 to the fourth conductive layer L4 has at least a portion formed of a conductive material. A first insulating layer I1, a second insulating layer I2, and a third insulating layer I3 are interposed between the first conductive layer L1 and the second conductive layer L2, between the second conductive layer L2 and the third conductive layer L3, and between the third conductive layer L3 and the fourth conductive layer L4, respectively. As is not shown in the figure, each of these insulating layers has a contact hole formed to have the electric connection between the upper side and the lower side thereof.

A power supply voltage V and a ground potential G, which are supplied from an external device through the connector C1 to the display module M, are supplied to the second conductive layer L2 and the third conductive layer L3, respectively. The first conductive layer L1 is used as a conductive layer for conducting a panel driving voltage VP for the display panel P generated based on the reference voltage V and the ground potential G, or a driver driving voltage VD for the driver D1 or the auxiliary driver D2, and the panel driving voltage VP and the driver driving voltage VD are supplied to the display panel P through the connector C2 and the flexible substrate F.

The fourth conductive layer L4 of the lowest layer, which corresponds to the rear surface of the power supply substrate B, can be arranged to have a predetermined potential. In the embodiment, all of a rear surface of the power supply substrate B is formed of conductive material.

In the display module M, a signal wiring for supplying signals, such as data signal and clock signal, from the driver D1 to the display panel P is arranged close to the fourth conductive layer L4, which is set to have a predetermined potential as mentioned above, so that influences regarding the power supply substrate B, such as variation or noise of the potential which passes through the signal wiring may be blocked by the fourth conductive layer L4. By means of this structure, the panel driving voltage generated from the power supply substrate B may be safely supplied to the display panel P.

In the embodiment, any of the first conductive layer L1 to fourth conductive layer L4 can be formed of a copper thin film.

Figure 4:
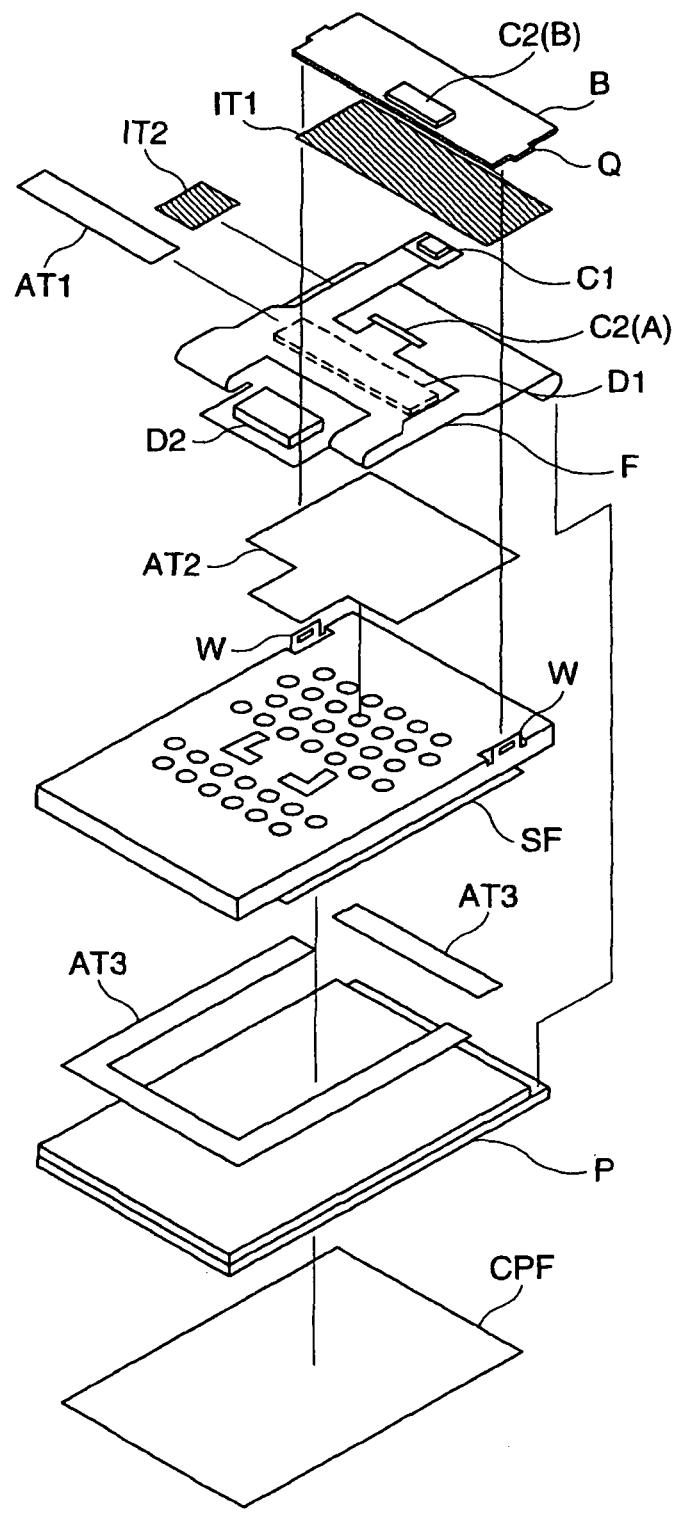
FIG. 4 shows an assembly view of the display module according to the embodiment of the present invention.

Next, a configuration of the display module M will be described with reference to FIG. 4. A circular polarization film CPF is arranged in a main surface of a display surface (a direction where light is emitted) of the display panel P. The frame SF is attached to a side which is opposed to the main surface of the display surface side of the display panel P by an attachment tape AT3.

The flexible substrate F is attached to the main surface of the side which is opposed to the main surface of a side to which the display panel P is attached in the frame SF, by an attachment tape AT2. The driver D1 and the auxiliary driver D2 are arranged in a first main surface of the side which is opposed to the main surface of the frame SF side in the flexible substrate F as mentioned above. The driver D1 is interposed between the first main surface of the flexible substrate F and the portion where the flexible substrate F is bent, and the attachment tape AT1 is interposed between the driver D1 and the bent portion.

The power supply substrate B is arranged in the first main surface of the flexible substrate F through an insulating tape IT1. Furthermore, the power supply substrate B is fixed by a mechanism for inserting a protrusion Q formed in the power supply substrate B into a hole formed in a protrusion W of the frame SF. In the meantime, electrical connection is implemented by connecting a connector C2 (A) formed in the flexible substrate F to a connector C2 (B) formed in the power supply substrate B. By using such a simple mechanism, the power supply substrate B can be fixed while it is electrically connected thereto, so that the power supply substrate B may be readily replaced with a new one when it is determined to have a fault. In addition, the power supply substrate B having different performance such as output of driving voltage or the like may readily replaced with a new one.

In addition, the power supply substrate B is arranged separately from the driver D1, so that a dedicated terminal for checking may be arranged for each of the driver D1 and the power supply substrate B. As a result, factor of the problem may be checked in a short time, and thus it is possible to relatively perform the performance evaluation of the power supply substrate B and the driver D.

Figure 5:
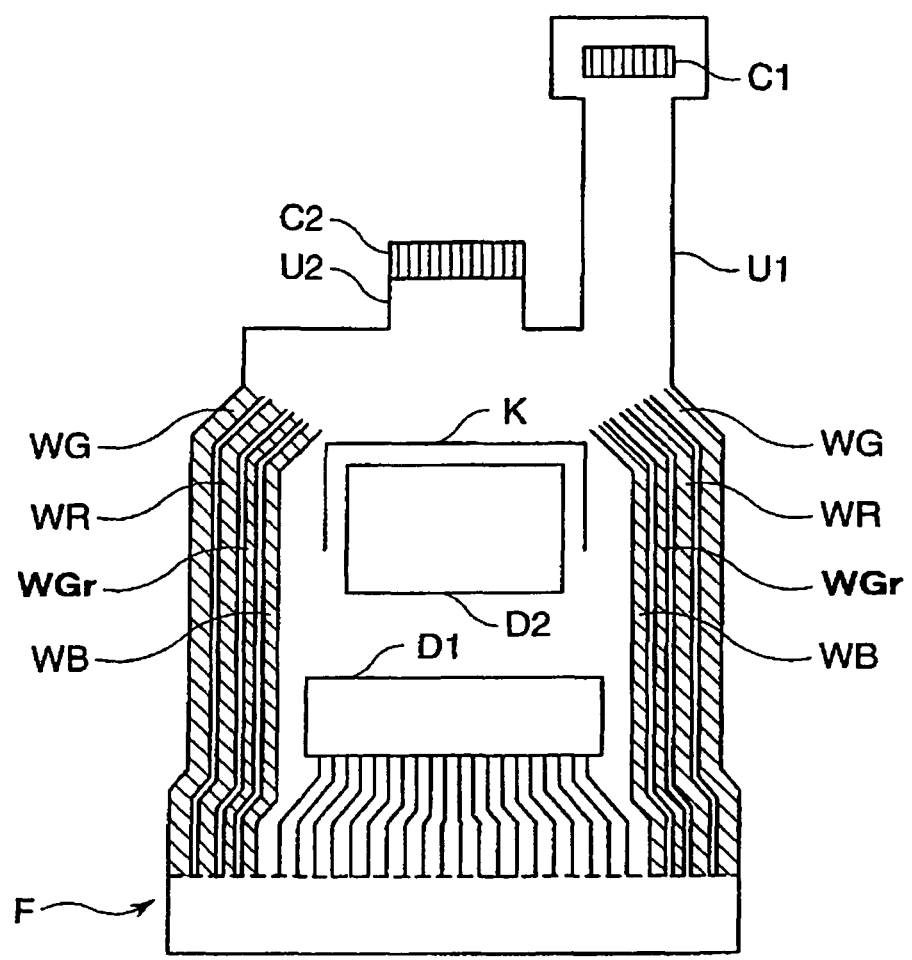
FIG. 5 shows a planar structure of a flexible substrate according to the embodiment of the present invention.

Referring to FIG. 5, a detailed structure of the flexible substrate F will be described.

As mentioned above, a notch K is formed in the flexible substrate F along at least a portion of at least a side of the auxiliary driver D2 and two sides crossing with the side. By means of this structure, the auxiliary driver D2 is not bent even if the flexible substrate F is bent as shown in FIG. 2.

The connector C1 for connection with the flexible substrate F is formed at an edge of a first protrusion U1 protruding from the base of the flexible substrate, and the connector C2 formed for connection with the flexible substrate F is formed at an edge of a second protrusion U2 protruding from the base of the flexible substrate. As apparent from FIG. 5, a distance from the connector C1 to the root portion of the first protrusion is longer than that from the connector C2 to the root portion of the second protrusion. By this structure, as seen from FIG. 1 described above, the connector C1 is protruded from the periphery of the display panel P when the display panel P and the flexible substrate are connected to each other to be mounted. Since the connector C1 is protruded from the display panel P, the connection between the connector C1 and an external device may be sterically facilitated.

The flexible substrate F includes a wiring WG for supplying a ground potential G to the display panel P, a wiring WR for supplying a driving voltage for red pixel (a red electro-optical element) to the display panel P, a wiring WGr for supplying a driving voltage for green pixel (a green electro-optical element) to the display panel P, and a wiring WB for supplying a driving voltage for blue pixel (a blue electro-optical element) to the display panel P. The wiring WG, among the above-mentioned wirings, is formed at the outermost of the flexible substrate F, and the wiring WG, wiring WR, wiring WGR, and wiring WB are formed in this order from the periphery of the flexible substrate F.

The wiring WG is connected to a common electrode that is formed to face the pixel electrode in the display panel P, which leads to increase a line width of the wiring WG so as to reduce the wiring resistance. As a result, the wiring WG has a line width larger than that of any of the wirings WR, WGr, and WB.

The line widths of the wirings WR, WGr, and WB may be properly adjusted in consideration of the property or color balance of an organic electroluminescent (EL) element arranged in a pixel, and luminous efficiency of the organic EL element for red pixel employed in the present embodiment is relatively lower than that for green pixel, and the line width is set to be WR>WB>WGr in consideration of the color balance or the like.

Next, transmitting path for various signals, such as various voltages and data signals, in the display module M will be described with reference to schematic views of FIGS. 6 to 8.

Supplying the ground potential G will be described with reference to FIG. 6. The ground potential G supplied from the external device E through the connector C1 is supplied to the driver D1, the auxiliary driver D2, and the display panel P. Furthermore, it is supplied through the second connector C2 to the power supply substrate B formed separately from the flexible substrate F.

A driving voltage supplied to the driver D and the display panel P will be described with reference to FIG. 7. The power supply voltage V supplied from the external device E through the connector C1 is first input to the power supply substrate B through the second connector C2. The power supply substrate B generates a driver driving voltage VD supplied to the driver D and a panel driving voltage VP supplied to the display panel P, based on the power supply voltage V and the above-mentioned ground potential G.

The driver driving voltage includes, for example, a reference voltage of D/A converter, a precharge voltage, or a driving voltage for scanning line driving circuit.

In the meantime, the panel driving voltage VP is supplied not through the driver D1, but directly supplied to the display panel. The panel driving voltage VP includes, for example, driving voltages for driving the electro-optical elements. These driving voltages are supplied to the display panel P through the wiring WR for supplying the driving voltage for red pixel (the red electro-optical element) to the display panel P, the wiring WGr for supplying the driving voltage for green pixel (the green electro-optical element) to the display panel P, and the wiring WB for supplying the driving voltage for blue pixel (the blue electro-optical element) to the display panel P, as described with regard to FIG. 5.

A control signal SP supplied from the driver D1 is employed to adjust the generation or the level of the driver driving voltage VD or the panel driving voltage VP. As the control signal SP, for example, data regarding the usage circumstance, such as degradation or temperature of the electro-optical element of the display panel P is supplied to the power supply substrate B, so that the panel driving voltage VP or the driver driving voltage VD may be initially set at shipment or reset in the field.

For example, when the display panel P consists of organic EL elements for red (R), green (G), and blue (B), having different luminous colors, the driving voltage of the organic EL elements may be adjusted in response to color balance adjustment, temporal variation, or usage circumstance, so that the control signal SP generated as mentioned above may be supplied to the power supply substrate B, which leads to properly adjust the level of the panel driving voltage VP.

In addition, when it is necessary to adjust the data signal supplied to the display panel P based on the above-mentioned conditions, the control signal SP may be supplied to the power supply substrate B, thereby changing or adjusting the reference voltage of the D/A converter.

Next, supplying the control signal for controlling the driver D will be described with reference to FIG. 8. The control signal S supplied from the external device E through the first connector C1 is input to the driver D1. The control signal S, for example, includes, digital data for performing D/A conversion, a clock signal for controlling timing as a reference signal, a signal for generating a scanning signal or the like. The driver D1 generates the above-mentioned various signals to be supplied to the display panel P based on the control signal S.

Figure 6:
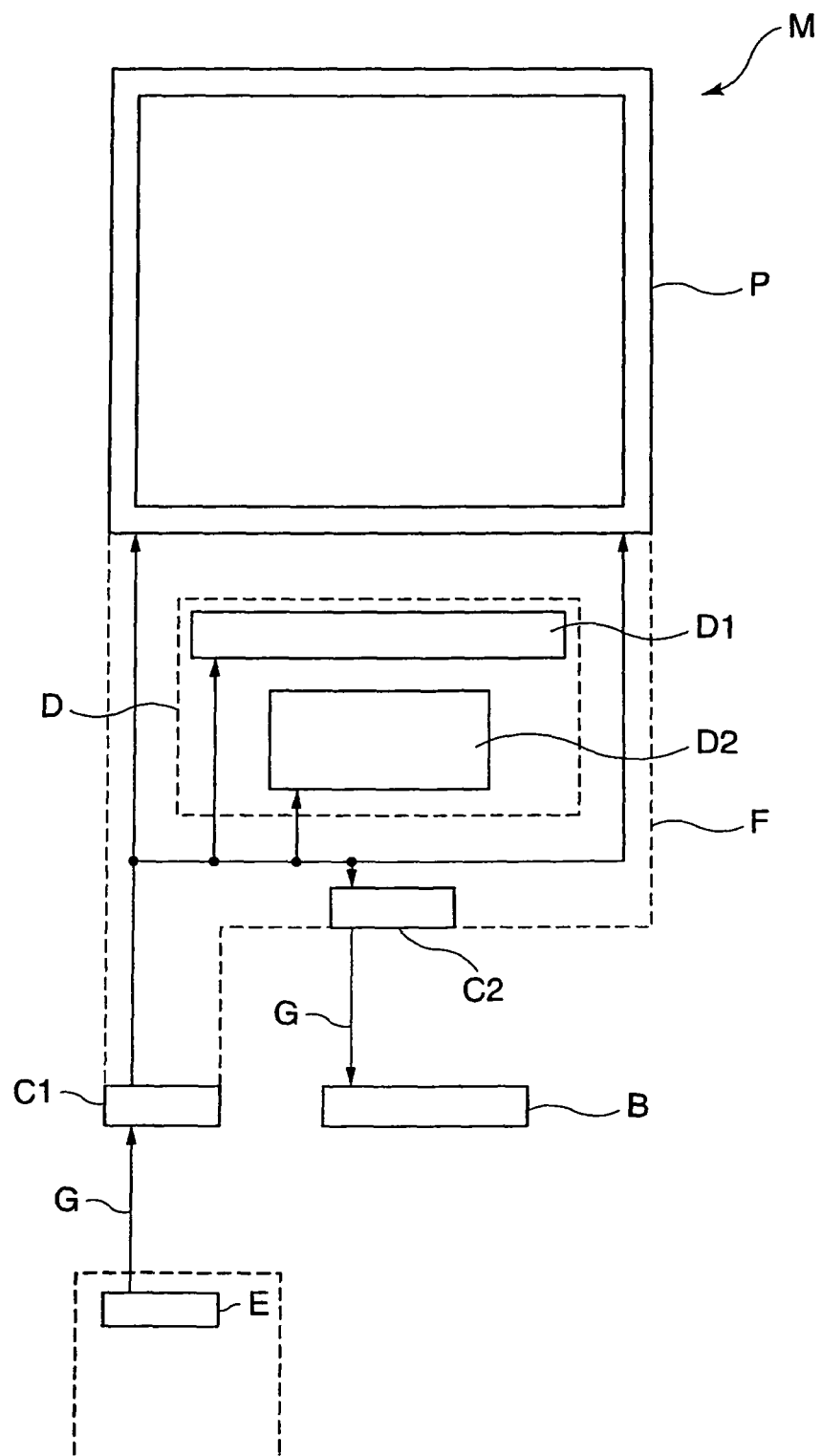
FIG. 6 shows a schematic view of a wiring structure of the flexible substrate according to the embodiment of the present invention.
Figure 7:
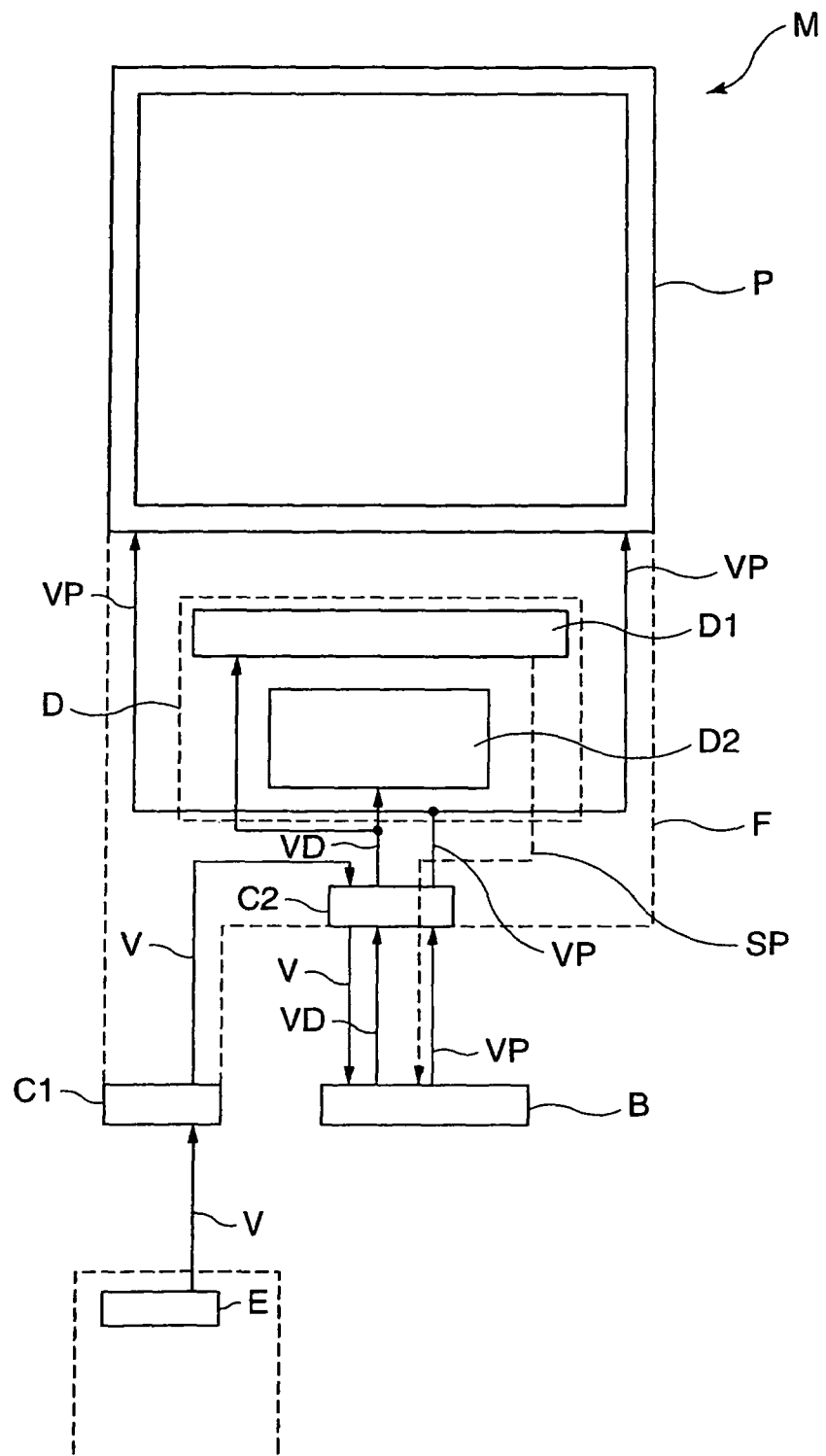
FIG. 7 shows a schematic view of the wiring structure of the flexible substrate according to the embodiment of the present invention.
Figure 8:
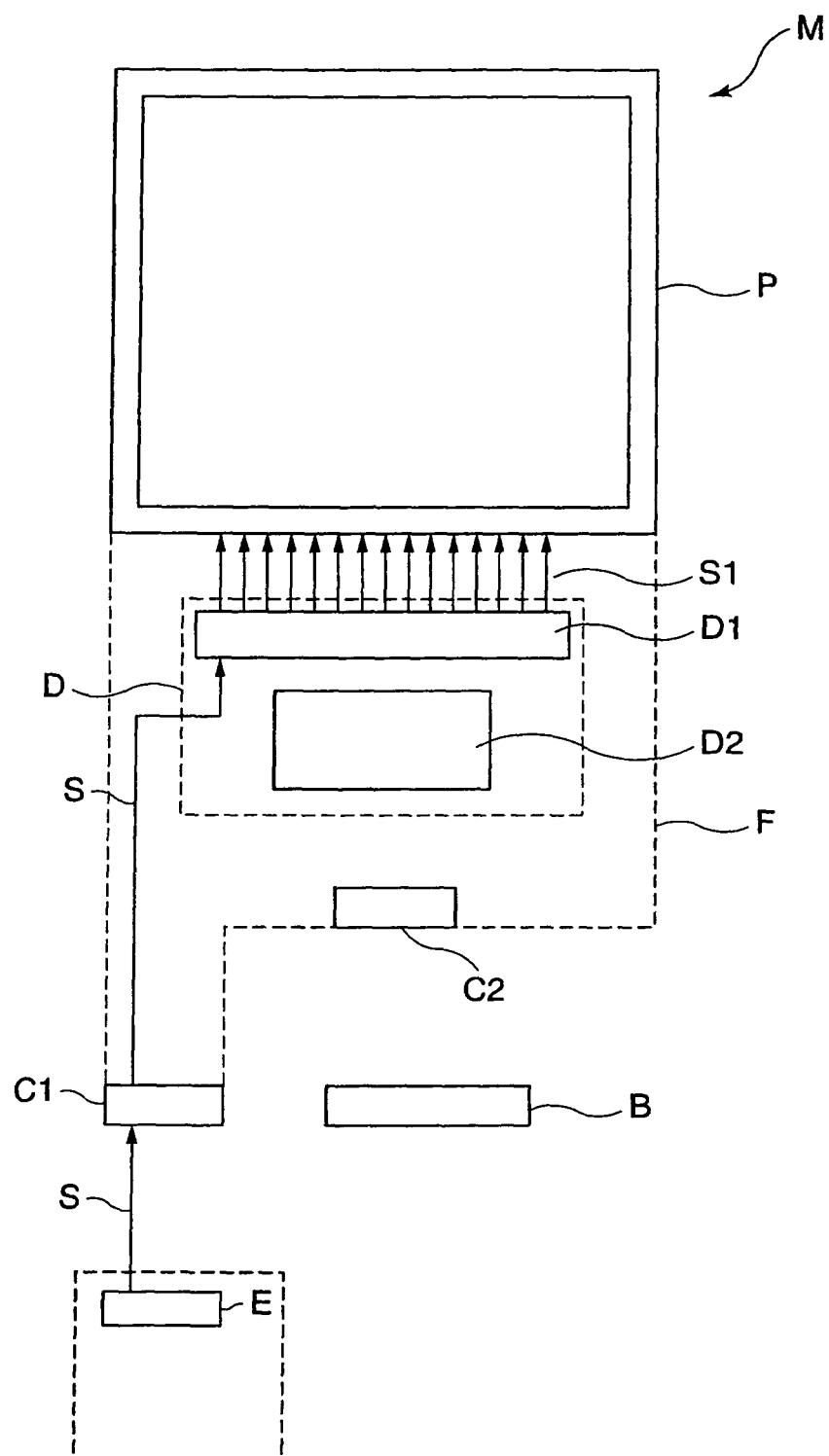
FIG. 8 shows a schematic view of the wiring structure of the flexible substrate according to the embodiment of the present invention.

By the configurations shown in FIGS. 6 to 8, following effects may be obtained. To detail this, the power supply voltage V input from the external device E is not input to the driver D but input to the power supply substrate B through a short path such as the connector C2, which leads to reduce voltage drop due to wiring dragging or influence from external variation factors of voltage.

In the present embodiment, specifically, a wiring distance from the connector C1 to the power supply substrate B of the wiring formed in order to supply the power supply voltage V or the ground potential G is set to be shorter than that from the connector C1 to the driver D1 of the wiring formed in order to supply the control signal S.

In addition, the wiring width ranging from the connector C1 to the power supply substrate B of the wiring formed in order to supply the power supply voltage V or the ground potential G is set to be larger than that ranging from the connector C1 to the driver D1 of the wiring for control signal S. By this configuration, problems such as voltage drop of the power supply voltage V or noise occurrence may be reduced.

Figure 9:
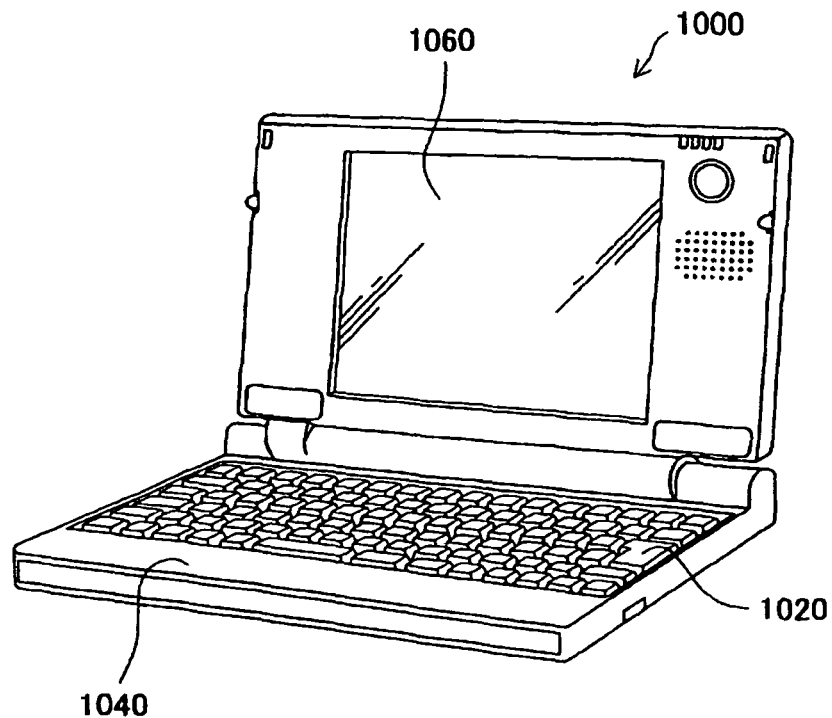
FIG. 9 shows a view for explaining an electronic apparatus according to the embodiment of the present invention.

The above-mentioned display module may be mounted in various electronic apparatuses including a mobile type personal computer, cellular phone, digital still camera or the like. FIG. 9 shows a perspective view of the configuration of a mobile type personal computer. The personal computer 1000 can include a body 1040 having a keyboard 1020, and a display 1060 using the display module in accordance with the embodiment of the invention.

Figure 10:
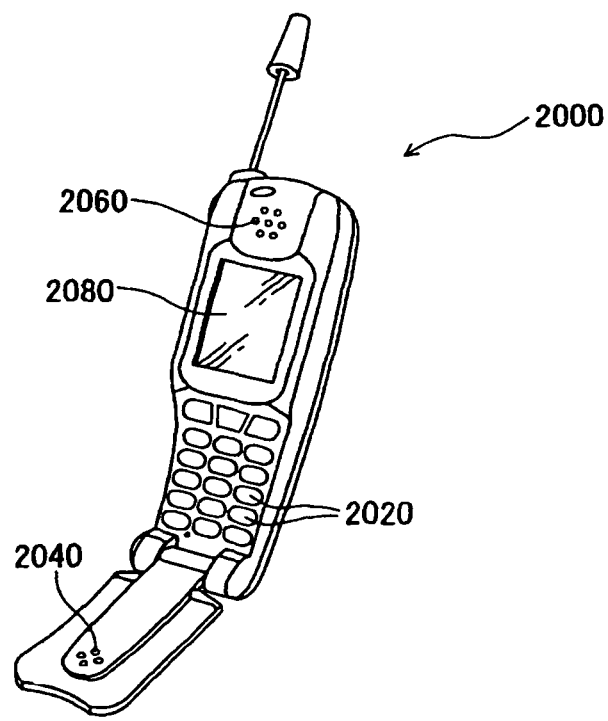
FIG. 10 shows a view for explaining an electronic apparatus according to the embodiment of the present invention.

FIG. 10 shows a perspective view of the cellular phone. The cellular phone 2000 includes a plurality of operating buttons 2020, a sender 2040, a receiver 2060, and a display 2080 using the display module in accordance with the embodiment of the invention.

Figure 11:
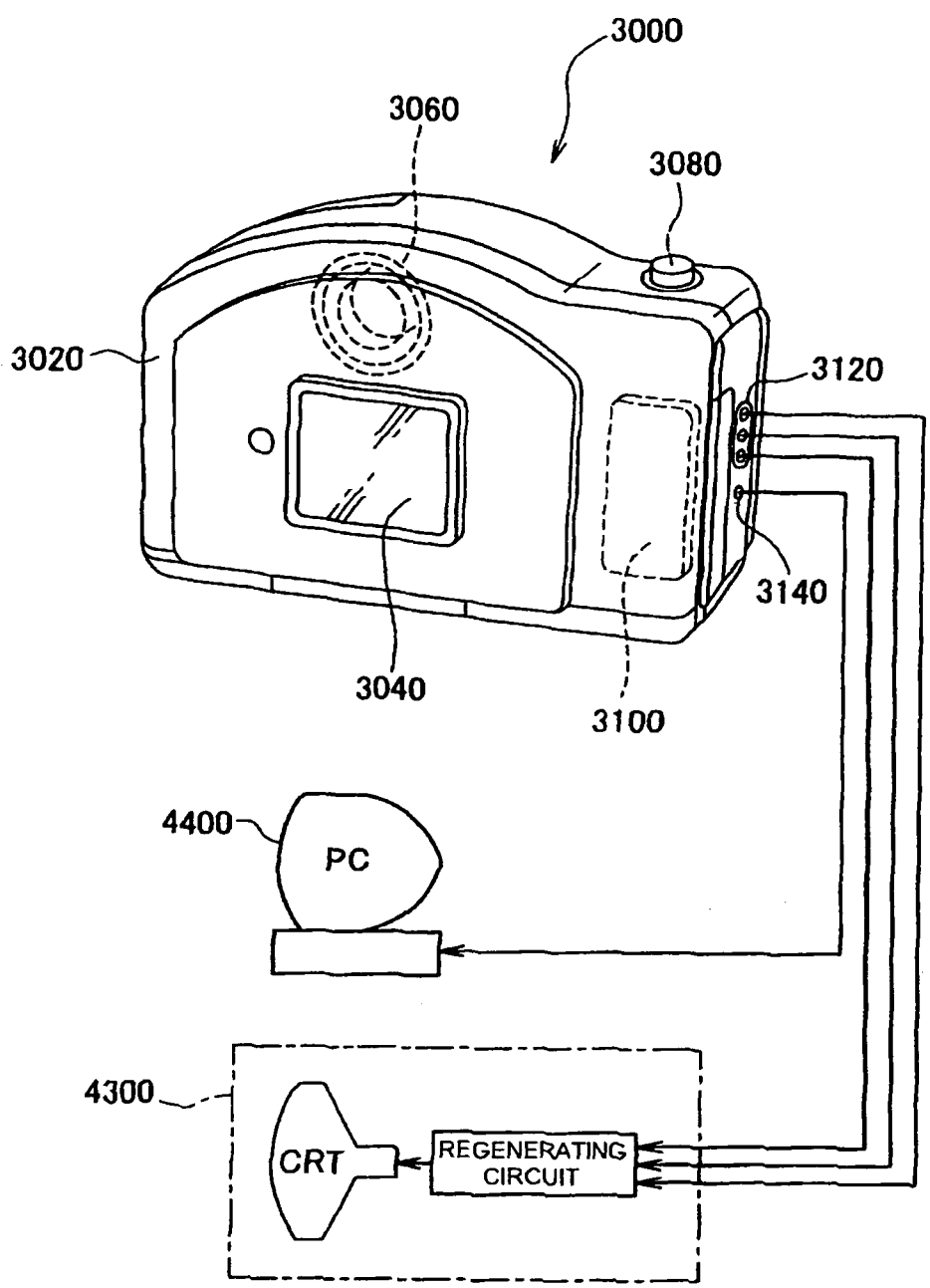
FIG. 11 shows a view for explaining an electronic apparatus according to the embodiment of the present invention.

FIG. 11 shows a perspective view of a configuration of the digital still camera 3000. In addition, this figure readily shows connection between the digital still camera and an external device. A typical camera is photosensitive to a film by the use of light image of an object, whereas the digital still camera 3000 generates an image pickup signal by using photoelectric conversion of an image pickup device, such as Charge Coupled Device (CCD) for the light image of the object. In this case, a display 3040 using the display module in accordance with the embodiment of the present invention is arranged in the rear surface of the case 3020 of the digital still camera 3000, so that display is performed based on the pickup signal by the CCD. With this configuration, the display 3040 acts as a finder for displaying the object. In addition, a light receiving unit 3060 including optical lens or CCD is arranged in the observation side (which is the rear side thereof in the same figure) of the case 3020.

When a photographing user recognizes an image of the object displayed in the display panel 3040 to press a shutter button 3080, the pickup signal of the CCD at this time is transmitted and stored to a memory of a circuit substrate 3100. In addition, a video signal output terminal 3120 and an input/output terminal 3140 for data communication are arranged in the side of the case 3020 in the digital still camera 3000. The former video signal output terminal 3120 is connected to a television monitor 4300 and the latter input/output terminal 3140 for data communication is connected to the personal computer 4400, if necessary as shown in the figure. In addition, by using a predetermined operation, the pickup signal stored in the memory of the circuit substrate 3100 is output to the television monitor 4300 or the personal computer 4400.

In addition, the electronic apparatus may include not only the personal computer of FIG. 9, the cellular phone of FIG. 10, the digital still camera of FIG. 11, but also television, view finder type or monitor direct viewing type video tape recorder, car navigation device, pager, electronic notebook, electronic calculator, word processor, workstation, picture phone, Point of Sale (POS) terminal, device having touch panel, and the like.

While this invention has been described in conjunction with the specific embodiments thereof, it is evident that many alternatives, modifications, and variations will be apparent to those skilled in the art. Accordingly, preferred embodiments of the invention as set forth herein are intended to be illustrative, not limiting. There are changes that may be made without departing from the spirit and scope of the invention.

What is claimed is:

1. An electro-optical module, comprising:
an electro-optical panel that has a plurality of electro-optical elements;
a wiring substrate that is connected to the electro-optical panel, the wiring substrate including a driver generating a signal to be supplied to the electro-optical panel; and
a power supply substrate that generates a driving voltage driving the plurality of electro-optical elements,
the driving voltage being supplied from the power supply substrate to the wiring substrate through a connector portion disposed on the wiring substrate, and then to the electro-optical panel,
the wiring substrate being separate from the power supply substrate.

2. The electro-optical module according to claim 1,
the electro-optical panel having a first plane from which lights from the plurality of electro-optical elements exit and a second plane opposite to the first plane,
the power supply substrate being disposed on a side of the second plane.

3. The electro-optical module according to claim 1,
the electro-optical panel having a first plane from which lights from the plurality of electro-optical elements exit and a second plane opposite to the first plane, the wiring substrate being disposed on a side of the second plane.

4. The electro-optical module according to claim 1, wherein the wiring substrate is a flexible substrate.

5. The electro-optical module according to claim 4, the power supply substrate being attached to the flexible substrate.

6. The electro-optical module according to claim 4, the wiring substrate being attached to the flexible substrate.

7. The electro-optical module according to claim 4, the wiring being attached to the flexible substrate.

8. The electro-optical module according to claim 4, the flexible substrate being folded at least one time.

9. The electro-optical module according to claim 8, the flexible substrate being folded at least two times.

10. The electro-optical module according to claim 9, the flexible substrate being folded such that the flexible substrate sandwiches the power supply substrate.

11. The electro-optical module according to claim 1, the driving voltage being supplied directly from the power supply substrate to the electro-optical panel through the wiring that is not connected to the driver.

* * * * *